United States Patent
Shibata et al.

(10) Patent No.: US 7,770,781 B2
(45) Date of Patent: Aug. 10, 2010

(54) BONDING METHOD

(75) Inventors: Yoshinori Shibata, Toyota (JP);
Yoshinori Ishikawa, Toyota (JP);
Teruyoshi Ichiyanagi, Nagoya (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 139 days.

(21) Appl. No.: 12/223,538

(22) PCT Filed: Feb. 5, 2008

(86) PCT No.: PCT/JP2008/052209

§ 371 (c)(1),
(2), (4) Date: Aug. 1, 2008

(87) PCT Pub. No.: WO2008/096886

PCT Pub. Date: Aug. 14, 2008

(65) Prior Publication Data

US 2009/0020587 A1    Jan. 22, 2009

(30) Foreign Application Priority Data

Feb. 8, 2007  (JP) ............................. 2007-029582

(51) Int. Cl.
    *B23K 31/02*   (2006.01)
(52) U.S. Cl. .................. 228/248.1; 228/233.1
(58) Field of Classification Search ............... None
    See application file for complete search history.

(56) References Cited

U.S. PATENT DOCUMENTS

| | | | | |
|---|---|---|---|---|
| 2,792,302 | A * | 5/1957 | Mott ........................... | 419/37 |
| 2,838,829 | A * | 6/1958 | Goss et al. ................... | 419/27 |
| 3,266,893 | A * | 8/1966 | Duddy ......................... | 419/2 |
| 3,716,347 | A * | 2/1973 | Bergstrom et al. ......... | 428/550 |
| 3,888,663 | A * | 6/1975 | Reichman .................... | 419/2 |
| 4,325,734 | A * | 4/1982 | Burrage et al. .............. | 419/60 |
| 5,028,367 | A * | 7/1991 | Wei et al. ..................... | 264/656 |
| 5,578,527 | A * | 11/1996 | Chang et al. ............. | 156/273.9 |
| 6,197,407 | B1 * | 3/2001 | Andou et al. ............... | 428/209 |

(Continued)

FOREIGN PATENT DOCUMENTS

JP    A-2004-025196    1/2004

(Continued)

Primary Examiner—Kiley Stoner
(74) Attorney, Agent, or Firm—Oliff & Berridge, PLC

(57) ABSTRACT

At a comparatively early stage, members to be bonded are pressurized together by an applied pressure that is a comparatively low pressure. Under an applied pressure condition (a gas venting process) of the comparatively low pressure, an organic protective film is vaporized by heating a bonding material, and a void portion of a porous structure that is formed by metal nanoparticles and a binder in the bonding material is not collapsed any more than necessary due to the applied pressure. Thus, the void portion of the porous structure functions as a degassing path for the gasified organic protective film, and the gas is smoothly released from between the members to be bonded. At the time point when the temperature of the bonding material has reached a predetermined temperature, the applied pressure is increased from the comparatively low pressure to a comparatively high pressure (a pressure increase process). Further, the bonding strength is increased by bonding the members to be bonded together by applying the comparatively high pressure (a bonding process).

8 Claims, 3 Drawing Sheets

U.S. PATENT DOCUMENTS

| | | | |
|---|---|---|---|
| 6,199,751 B1* | 3/2001 | Gaynes et al. | 228/195 |
| 6,563,225 B2* | 5/2003 | Soga et al. | 257/782 |
| 6,924,971 B2* | 8/2005 | Satsu et al. | 361/311 |
| 7,648,406 B2* | 1/2010 | Tai et al. | 445/50 |
| 2001/0038803 A1* | 11/2001 | Morales et al. | 419/37 |
| 2002/0006728 A1* | 1/2002 | Matsui et al. | 438/693 |
| 2003/0165412 A1* | 9/2003 | Matsui et al. | 422/245.1 |
| 2004/0131934 A1* | 7/2004 | Sugnaux et al. | 429/209 |
| 2004/0177997 A1* | 9/2004 | Hata et al. | 174/257 |
| 2005/0007398 A1* | 1/2005 | Hirai | 347/1 |
| 2005/0079707 A1* | 4/2005 | Tsukahara et al. | 438/660 |
| 2005/0175507 A1* | 8/2005 | Tsukruk | 422/68.1 |
| 2006/0113671 A1* | 6/2006 | Isa et al. | 257/758 |
| 2007/0107827 A1* | 5/2007 | Takahashi et al. | 156/64 |
| 2007/0131912 A1* | 6/2007 | Simone et al. | 252/500 |
| 2007/0183920 A1* | 8/2007 | Lu et al. | 419/9 |
| 2007/0221712 A1* | 9/2007 | Matsumoto et al. | 228/248.1 |
| 2007/0259474 A1* | 11/2007 | Shin et al. | 438/99 |
| 2008/0175885 A1* | 7/2008 | Asgari | 424/426 |
| 2009/0025967 A1* | 1/2009 | Boureghda et al. | 174/257 |
| 2009/0162557 A1* | 6/2009 | Lu et al. | 427/383.3 |

FOREIGN PATENT DOCUMENTS

| | | | |
|---|---|---|---|
| JP | 2004-107728 A | * | 4/2004 |
| JP | A-2004-130371 | | 4/2004 |
| JP | A-2005-205696 | | 8/2005 |
| JP | A-2007-019360 | | 1/2007 |
| JP | 2007-44754 A | * | 2/2007 |
| WO | WO 2004/026526 A1 | | 4/2004 |
| WO | WO 2005/095040 A1 | | 10/2005 |

* cited by examiner

F I G. 2
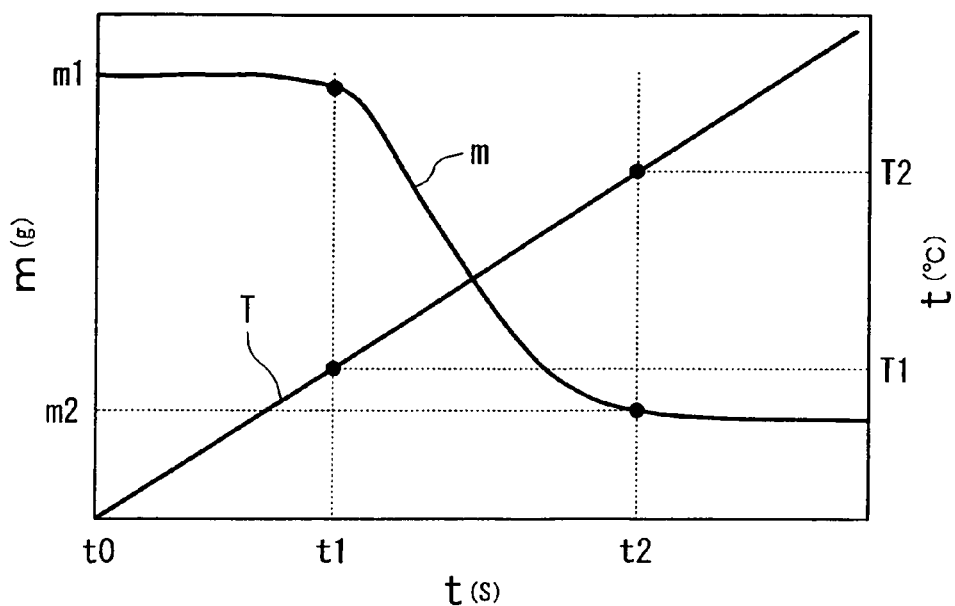
F I G. 3
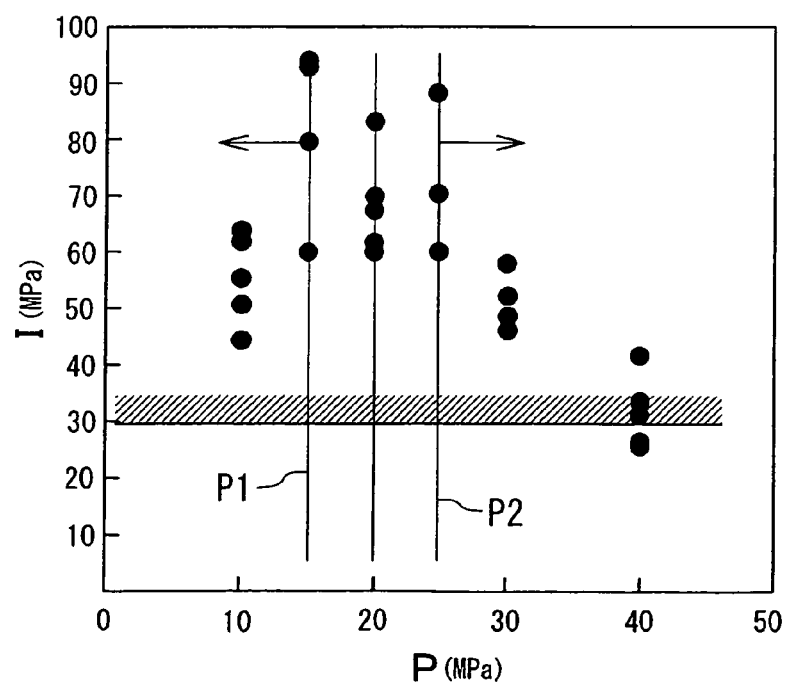

F I G. 4
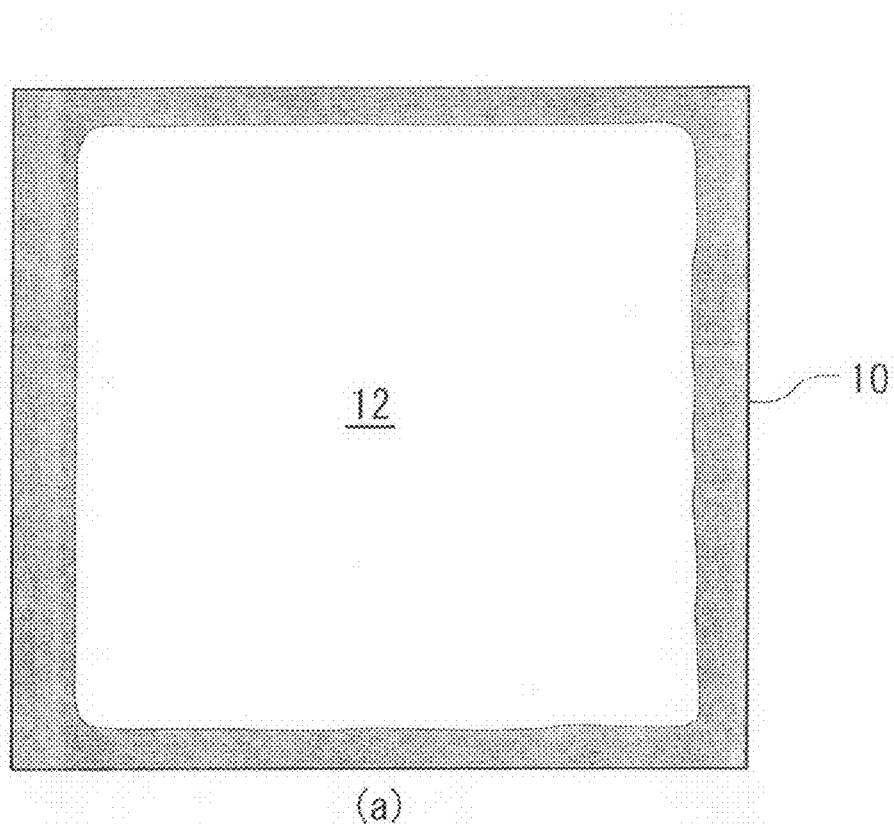
(a)
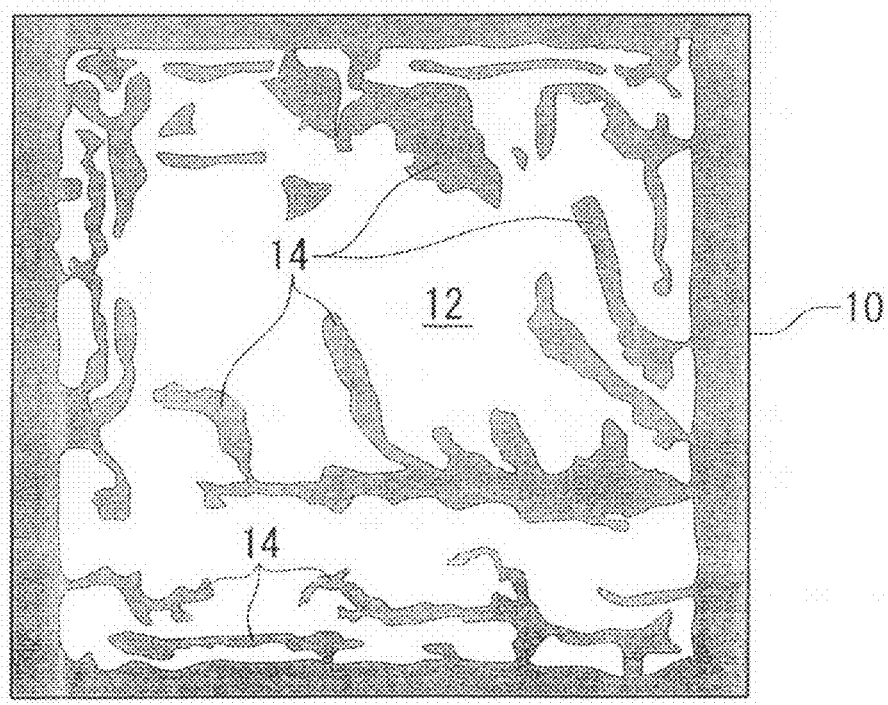
(b)

BONDING METHOD

TECHNICAL FIELD

The present invention relates to a bonding method that bonds members to be bonded together by carrying out heating and firing while metal nanoparticles are held at a predetermined position between the members to be bonded.

BACKGROUND ART

In known technology, various techniques such as soldering, bonding, welding and the like have been used as a technique for bonding members together. On the other hand, in recent years, taking into consideration that more serious attention must be given to environmental contamination and that there are cases in which these conventional bonding techniques are inappropriate due to the properties of the members to be bonded, a bonding technology that differs from the known technology and that uses metal nanoparticles has come to be used (refer, for example, to Patent Document 1).

Patent Document 1: Japanese Patent Application Publication No. JP-A-2004-130371

DISCLOSURE OF THE INVENTION

Problems to be Solved by the Invention

This bonding technology that uses metal nanoparticles is a bonding method that bonds the members to be bonded together by heating and pressurizing the members to be bonded and a bonding material, and then firing the bonded members in a state where the bonding material that includes metal nanoparticles, which are coated by an organic protective film, and a binder is applied to a predetermined position of each of the members to be bonded such that the bonding material is held between the members to be bonded.

Since the metal nanoparticles that are used here are coated by an organic protective film, and further, the metal nanoparticles are mixed with a binder and a solvent, this can be handled at room temperature as a bonding material that has the consistency of a paste. In addition, when the bonded members are sintered, it is necessary to heat the members to be bonded and the bonding material, and pressurize the bonded material. However, because the bonding strength of the bonded members is reduced when this applied pressure is either too high or too low, there is a difficulty in that a set range of the pressure condition is narrow in the bonding method that uses metal nanoparticles.

Such a problem originates in a mechanism that occurs during the firing process of the bonding material. Specifically, in the bonding material that has the consistency of a paste, the solvent and the organic protecting film vaporize due to being heated, and the bonded material then exhibits a porous structure due to the metal nanoparticles and the binder. In addition, by collapsing a void portion of such a porous structure by applying the pressure, the metal nanoparticles are bonded at a high density, and the bonded strength increases. However, the void portion of the porous structure functions as a degassing path for the gasified organic protective film. Thus, the imparting of an excessive applied pressure to the bonded material seals off the degassing path. In addition, the gas that has lost an escape path as a result of the sealing off of the degassing path is discharged all at once from the bonding material, and the binder and the metal nanoparticles are ejected from the bonding surface, resulting in a decrease in the bonding strength.

FIG. 4 schematically shows the fracture surface that is obtained by peeling apart members that have been bonded together by using metal nanoparticles. Here, (a) shows the normal fracture surface in the case where a suitable pressure has been applied, and (b) shows the defective fracture surface in the case where an excessive pressure has been applied. In the normal fracture surface that is shown in (a), a bonding material 12 is spread evenly over the surface of a bonded member 10, while in contrast, in the defective fracture surface that is shown in (b), it can be understood from gas ejection pits 14 that irregularities have occurred in the bonding material 12.

In light of the problems described above, it is an object of the present invention to stably obtain a necessary bonding strength by applying a suitable pressure during the firing of a bonding material, in a bonding method that uses metal nanoparticles.

Means for Solving the Problems

In order to solve the above-described problems, the bonding method of the present invention makes the gas discharge capacity compatible with the bonding capacity during the heating and the firing of the bonding material by applying a bonding material that includes metal nanoparticles, which are coated by an organic protective film, and a binder to a bonding surface of each of the members to be bonded, overlaying and aligning the members to be bonded together, heating the bonding material so as to attain a bonding temperature thereof or higher, and at a comparatively early stage of the bonding process, setting the pressure condition such that the discharge of a gas from the bonding material is carried out smoothly, and at the time point when the firing of the bonding material has progressed and the discharge of the gas from the bonding material has stopped, setting the applied pressure condition such that the bonding strength is improved.

Modes of the Invention

The following modes of the invention illustrate the structure of the present invention, and in order to facilitate the understanding of the various structures of the present invention, explanations will be provided in separate sections. In addition, these sections do not limit the technical scope of the present invention. Thus, while referring to the best modes for carrying out the invention, the exchange or elimination of some of the structural elements of each section or the further addition of other structural elements can be included in the technical scope of the present invention.

(1) A bonding method is provided in which members to be bonded are bonded together by carrying out heating and firing in a state where metal nanoparticles are held at a predetermined position between the members to be bonded. In the bonding method, a bonding material that includes metal nanoparticles, which are coated with an organic protective film, and a binder is applied to a bonding surface of each of the members to be bonded, the members to be bonded are overlaid and aligned together, the members to be bonded are pressurized together by an applied pressure that is comparatively low while the bonding material is heated so as to attain a bonding temperature thereof or higher, a change in a predetermined physical quantity that occurs in any of the members to be bonded, the bonding material, and an ambient atmosphere thereof is measured, and at the time point when the change in the physical quantity has reached a certain amount, the applied pressure is increased to a comparatively high pressure.

According to the bonding method that is described in this section, in the bonding process in which the bonding material is applied to the bonding surface of each of the members to be bonded, the members to be bonded are overlaid and aligned together, the bonding material is heated so as to attain the bonding temperature thereof or higher, and at a comparatively early stage, the members to be bonded are pressurized together by an applied pressure that is comparatively low (a gas venting process). Under the applied pressure condition that is comparatively low (the gas venting process), the organic protective film is vaporized due to the bonding material being heated, and a void portion of the porous structure that is formed by the metal nanoparticles and the binder in the bonding material is not collapsed any more than necessary due to the pressure. Accordingly, the void portion of the porous structure functions as a degassing path for the gasified organic protective film, and the gas can be smoothly released from between the members to be bonded.

In this section, the change in a predetermined physical quantity that occurs in any of the members to be bonded, the bonding material, and the ambient atmosphere thereof are measured, and at the time point when the change in the physical quantity reaches a certain amount, the applied pressure is increased from a comparatively low pressure to a comparatively high pressure (a pressure increase process). In addition, because the members to be bonded are bonded together by applying the high pressure, the bonding strength is improved (a bonding process). Under such a comparatively high applied pressure condition (the bonding process), the void portion of the porous structure is suitably collapsed by the applied pressure and the metal nanoparticles are bonded at a high density, and thus the bonding strength is increased.

(2) A bonding method is provided in which members to be bonded are bonded together by carrying out heating and firing in a state where metal nanoparticles are held at a predetermined position between the members to be bonded. In the bonding method, a bonding material that includes metal nanoparticles, which are coated with an organic protective film, and a binder are applied to a bonding surface of each of the members to be bonded, the members to be bonded are overlaid and aligned together, the members to be bonded are pressurized together by an applied pressure that is comparatively low while the bonding material is heated so as to attain a bonding temperature thereof or higher, an elapsed time from the initiation of the heating is measured, and after the elapse of a certain time, the applied pressure is increased to a comparatively high pressure.

According to the bonding method that is described in this section, in a bonding process in which the bonding material is applied to the bonding surface of each of the members to be bonded, the members to be bonded are overlaid and aligned together, the bonding material is heated so as to attain the bonding temperature thereof or higher, and at a comparatively early stage, the members to be bonded are pressurized by an applied pressure that is comparatively low (the gas venting process). Under the applied pressure condition that is comparatively low (the gas venting process), the organic protective film is vaporized due to the bonding material being heated, and the void portion of the porous structure that is formed by the metal nanoparticles and the binder in the bonding material is not collapsed any more than necessary due to the applied pressure. Accordingly, the void portion of the porous structure functions as a degassing path for the gasified organic protective film, and the gas can be released smoothly from between the members to be bonded.

In this section, the elapsed time from the initiation of the heating is measured, and after a certain time has elapsed, the applied pressure is increased from a comparatively low pressure to a comparatively high pressure (the pressure increase process). In addition, because the members to be bonded are bonded together by the high applied pressure, the bonding strength is increased (the bonding process). Under such a comparatively high pressure condition (the bonding process), the void portion of the porous structure is suitably collapsed due to the applied pressure, the metal nanoparticles are bonded at a high density, and thus the bonding strength is increased.

(3) There is provided a bonding method (claim 1) in which members to be bonded are bonded together by carrying out heating and firing in a state where metal nanoparticles are held at a predetermined position between the members to be bonded, characterized in that a bonding material that includes metal nanoparticles, which are coated with an organic protective film, and a binder is applied to a bonding surface of each of the members to be bonded, the members to be bonded are overlaid and aligned together, the members to be bonded are pressurized together by an applied pressure that is comparatively low while the bonding material is heated so as to attain a bonding temperature thereof or higher, a change in a predetermined physical quantity that occurs in any of the members to be bonded, the bonding material, and an ambient atmosphere thereof, or an elapsed time from the initiation of the heating is measured, and at the time point when the change in the physical quantity has reached a certain amount or after the elapse of a certain time, the applied pressure is increased to a comparatively high pressure.

According to the bonding method that is described in this section, in the bonding process in which the bonding material is applied to the bonding surface of each of the members to be bonded, the members to be bonded are overlaid and aligned together, the bonding material is heated so as to attain the bonding temperature thereof or higher, and at a comparatively early stage, the members to be bonded are pressurized together by an applied pressure that is comparatively low (the gas venting process). Under the applied pressure condition that is comparatively low (the gas venting process), the organic protective film is vaporized due to the bonding material being heated, and the void portion of the porous structure that is formed by the metal nanoparticles and the binder in the bonding material is not collapsed any more than necessary due to the applied pressure. Accordingly, the void portion of the porous structure functions as a degassing path for the gasified organic protective film, and the gas is smoothly released from between the members to be bonded.

In this section, the change in a predetermined physical quantity that occurs in any of the members to be bonded, the bonding material, and the ambient atmosphere thereof or the elapsed time from the initiation of the heating is measured, and at the time point when the change in the physical quantity has reached a certain amount or after a certain time has elapsed, the applied pressure is increased from a comparatively low pressure to a comparatively high pressure (the pressure increase process). In addition, because the members to be bonded are bonded together by a high applied pressure, the bonding strength is increased (the bonding process). Under such a comparatively high applied pressure condition (the bonding process), the void portion of the porous structure is suitably collapsed by the applied pressure, the metal nanoparticles are bonded at a high density, and thus the bonding strength is improved.

(4) There is provided the bonding method (claim 2) based on the above-described section (3), wherein, in a test process, a temperature change in the members to be bonded or the bonding material is ascertained in advance from the initiation of the heating of the members to be bonded and the bonding material to the time point when thermal decomposition of the organic protective film has completed, and under a heating condition that is identical to that of the test process, the members to be bonded and the bonding material are heated, the temperature change in the members to be bonded or the bonding material from the initiation of the heating of the members to be bonded and the bonding material is measured, and at the time point when this temperature has reached a temperature corresponding to the time point when the thermal decomposition of the organic protective film has completed, the applied pressure is increased from a comparatively low pressure to a comparatively high pressure.

According to the bonding method that is described in this section, in the test process, after the initiation of the heating of the members to be bonded and the bonding material, the temperature of the members to be bonded or the bonding material at the time point when the thermal decomposition of the organic protective film has completed is ascertained in advance. Under the heating condition that is identical to that of the test process, the members to be bonded and the bonding material are heated. Thus, the timing of the switching from the gas venting process to the pressure increase process is correctly measured based on the temperature after the initiation of the heating and pressurization. As a result, both the gas venting operation and the bonding operations are reliably carried out.

(5) There is provided the bonding method (claim 3) based on the above-described section (3), wherein, in a test process, an amount of weight reduction from the initiation of the heating of the members to be bonded and the bonding material to the time point when thermal decomposition of the organic protective film has completed is ascertained in advance, and under a heating condition that is identical to that of the test process, the members to be bonded and the bonding material are heated, an amount of weight reduction in the bonding material from the initiation of the heating of the members to be bonded and the bonding material is measured, and at the time point when the amount of this reduction attains an amount of reduction corresponding to the time point when the thermal decomposition of the organic protective film has completed, the applied pressure is increased from a comparatively low pressure to a comparatively high pressure.

According to the bonding method that is described in this section, in the test process, the amount of the weight reduction from the initiation of the heating of the members to be bonded and the bonding material to the time point when the thermal decomposition of the organic protective film has completed is ascertained in advance. Under the heating condition that is identical to that of the test process, the members to be bonded and the bonding material are heated. Thus, the timing of the switching from the gas venting process to the pressure increase process is correctly measured based on the amount of the weight reduction in the bonding material. As a result, both the gas venting operation and the bonding operation are reliably carried out.

(6) There is provided the bonding method (claim 4) based on the above-described section (3), wherein, in a test process, the elapsed time from the initiation of the heating of the members to be bonded and the bonding material to the time point when thermal decomposition of the organic protective film has completed is ascertained in advance, and under a heating condition that is identical to that of the test process, the members to be bonded and the bonding material are heated, and at the time point when the heating time has reached a time that corresponds to the elapsed time, the applied pressure is increased from a comparatively low pressure to a comparatively high pressure.

According to the bonding method that is described in this section, in the test process, the elapsed time from the initiation of the heating of the members to be bonded and the bonding material to the time point when the thermal decomposition of the organic protective film has completed is ascertained in advance. Under the heating condition that is identical to that of the test process, the members to be bonded and the bonding material are heated. Thus, the timing of the switching from the gas venting process to the pressure increase process is accurately measured based on the elapsed time from the initiation of the heating and the pressurization. As a result, both the gas venting operation and the bonding operation are reliably carried out.

(7) There is provided the bonding method (claim 5) based on the above-described section (3), wherein, in a test process, an amount of reduction in the thickness of the bonding material from the initiation of the heating of the members to be bonded and the bonding material to the time point when thermal decomposition of the organic protective film has completed is ascertained in advance, and under a heating condition that is identical to that of the test process, the members to be bonded and the bonding material are heated, and at the time point when the amount of the reduction in the thickness of the bonding material from the initiation of the heating of the members to be bonded and the bonding material reaches an amount of reduction corresponding to the time point when the thermal decomposition of the organic protective film has completed, the applied pressure is increased from a comparatively low pressure to a comparatively high pressure.

According to the bonding method that is described in this section, the amount of the reduction in the thickness of the bonding material from the initiation of the heating of the members to be bonded and the bonding material to the time point when the thermal decomposition of the organic protective film has completed is ascertained in advance. Under the heating condition that is identical to that of the test process, the members to be bonded and the bonding material are heated. Thus, the timing of the switching from the gas venting process to the pressure increase process is correctly measured based on the amount of the reduction in the thickness of the bonding material. As a result, both the gas venting operation and the bonding operation are reliably carried out.

(8) There is provided the bonding method (claim 6) based on the above-described section (3), wherein, in a test process, an amount of increase in a decomposition gas concentration of the organic protective film that is present in the ambient atmosphere of the members to be bonded and the bonding material from the initiation of the heating of the members to be bonded and the bonding material to the time point when thermal decomposition of the organic protective film has completed is ascertained in advance, and under a heating condition that is identical to that of the test process, the members to be bonded and the bonding material are heated, and at the time point when the amount of the increase in the decomposition gas concentration of the organic protective film that is present in the ambient atmosphere of the members to be bonded or the bonding material from the initiation of the heating of the members to be bonded and the bonding material reaches an increased amount corresponding to the time point when the thermal decomposition of the organic protective film has completed, the applied pressure is increased from a comparatively low pressure to a comparatively high pressure.

According to the bonding method that is described in this section, the amount of the increase in the decomposition gas concentration of the organic protective film that is present in the ambient atmosphere of the members to be bonded or the bonding material from the initiation of the heating of the members to be bonded and the bonding material to the time point when the thermal decomposition of the organic protective film has completed is ascertained in advance. Under the heating condition that is identical to the test process, the members to be bonded and the bonding material are heated. Thus, the timing of the switching from the gas venting process to the pressure increase process is correctly measured based on the amount of the increase of the decomposition gas concentration of the organic protective film. As a result, both the gas venting operation and the bonding operation are reliably carried out.

(9) There is provided the bonding method (claim 7) based on any one of the above-described sections (1) to (8), wherein the ascertaining of the time point when the thermal decomposition of the organic protective film in the test process has completed is carried out based on a rate of change in the weight of the bonding material that occurs due to the heating of the members to be bonded and the bonding material.

According to the bonding method that is described in this section, the time point when the thermal decomposition of the organic protective film in the test process has completed is correctly ascertained based on the rate of the change in the weight of the bonding material that occurs due to the heating of the members to be bonded and the bonding material, that is, based on the rate of change in the weight that originates in the vaporization of the organic protective film from the bonding material.

(10) There is provided the bonding method (claim 8) based on any one of the above-described sections (1) to (8), wherein the values of an applied pressure that is comparatively low and an applied pressure that is comparatively high when the members to be bonded are pressurized together, and an increase rate per unit time when the applied pressure is increased from the comparatively low pressure to the comparatively high pressure are set depending on a composition of the bonding material.

According to the bonding method that is described in this section, bonding is carried out after optimal maximum and minimum applied pressures and a pressure increase rate during the pressure increase process have been set depending on the composition of the bonding material that is used. Thus, both the gas venting operation and the bonding operation are reliably carried out.

(11) A bonding method is provided in which, at the time point when at least two of the changes in the predetermined physical quantities or the elapsed times according to the above-described sections (3) to (6) reach a certain amount or a certain time, the applied pressure is increased from a comparatively low pressure to a comparatively high pressure.

According to the bonding method that is described in this section, the time point when the thermal decomposition of the organic protective film has completed is more correctly ascertained by using, as the determination reference, the changes in the plurality of physical quantities or the elapsed times according to the above-described sections (3) to (6).

EFFECTS OF THE INVENTION

Since the present invention is configured as described above, it is possible to stably obtain a necessary bonding strength in a bonding method that uses metal nanoparticles.

BRIEF DESCRIPTION OF THE DRAWINGS

FIG. 2 is a graph that shows an example of the heating characteristics of a bonding material that is obtained by thermoanalysis (TG);

FIG. 3 is a drawing that illustrates the relationship between the applied pressure that is applied to the members to be bonded and the bonding strength of the members to be bonded in a bonding process; and FIG. 4 schematically shows the fracture surfaces obtained by peeling apart the members that have been bonded together by using the metal nanoparticles, where (a) shows the normal fracture surface in the case where a suitable applied pressure has been applied, and (b) shows the defective fracture surface in the case where an excessive applied pressure has been applied.

DESCRIPTION OF THE REFERENCE NUMERALS

Figure 1:
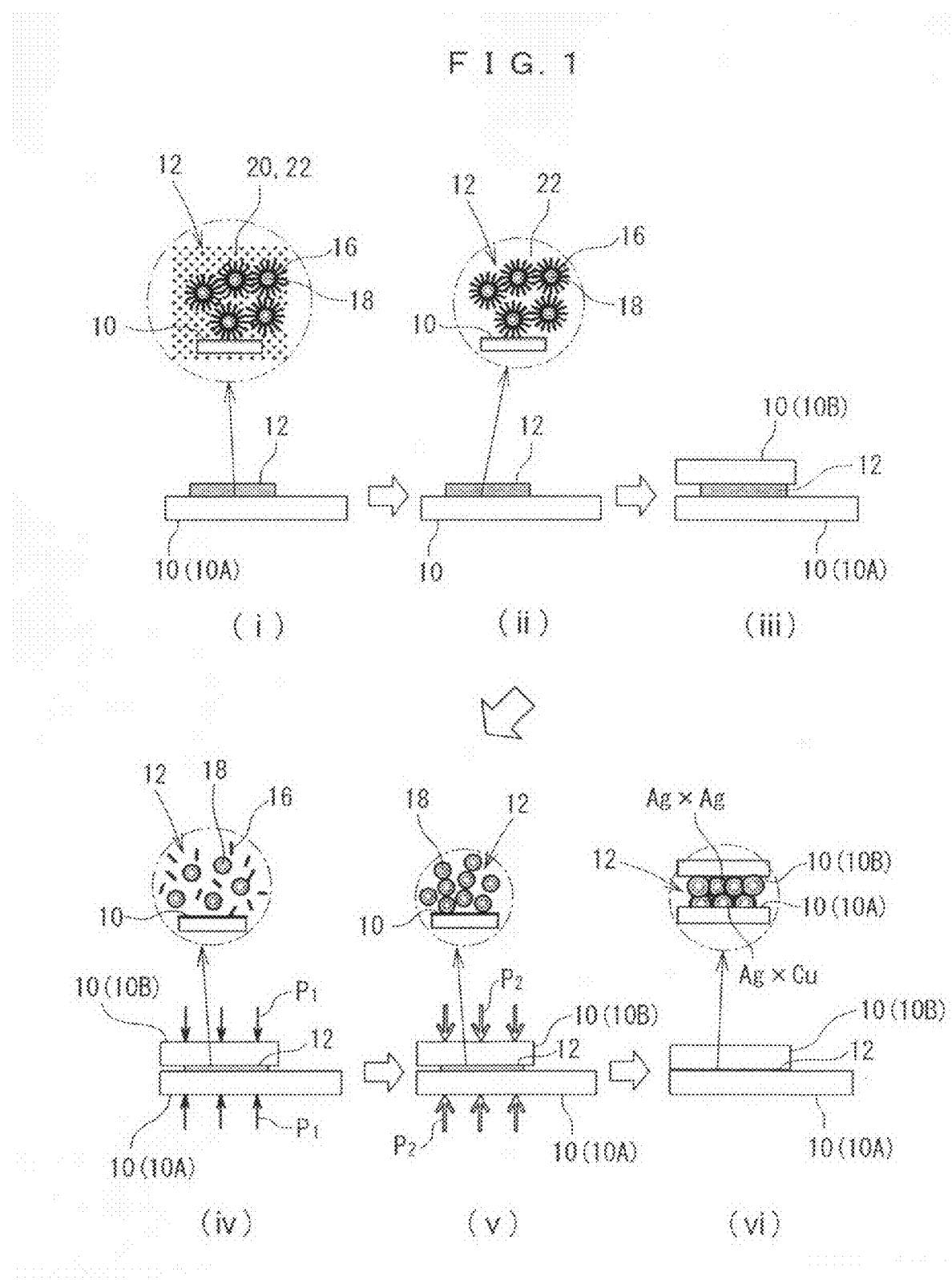
FIG. 1 is a schematic drawing that shows a bonding procedure in which members to be bonded are bonded together by using metal nanoparticles according to an embodiment of the present invention.

10, 10A, 10B: MEMBERS TO BE BONDED
12: BONDING MATERIAL
16: ORGANIC PROTECTIVE FILM
18: METAL NANOPARTICLES
20: BINDER
22: SOLVENT

BEST MODES FOR CARRYING OUT THE INVENTION

Hereinafter, the best modes for carrying out the present invention will be explained with reference to the appended drawings. Note that portions that are identical to or correspond to the background art are denoted by the identical reference numerals, and detailed explanations thereof are omitted.

FIG. 1 schematically shows a bonding procedure according to an embodiment of the present invention, in which members to be bonded are bonded together by using metal nanoparticles. In addition, FIG. 1 shows the state of a bonding material in each process in an enlarged manner as necessary.

(i) Application Process: A bonding material 12 that is a mixture of metal nanoparticles 18 that are coated by an organic protective film 16, a binder 20, and a solvent 22 is applied to the bonding surface of a member to be bonded 10 (10A). Note that, in the illustrated example, copper plates are used as the members to be bonded 10, silver nanoparticles are used as the metal nanoparticles 18, a resin flux for soldering is used as the binder 20, and alcohol is used as the solvent 22.

(ii) Drying Process: In the drying process, the bonding material 12, which has been applied to the bonding surface of the member to be bonded 10, is dried, and the solvent 20 is vaporized from the bonding material 12.

(iii) Assembly Process: A member to be bonded 10 (10B) is overlaid on and aligned with the member to be bonded 10 (10A) to which the bonding material 12 has been applied, and the bonding material 12 is sandwiched between the two members to be bonded 10 (10A, 10B).

(iv) Heating-Pressurizing Process (a gas venting process): While the bonding material 12 is heated so as to attain the bonding temperature thereof or higher, the members to be bonded 10 (10A, 10B) are pressurized together by an applied pressure that is comparatively low.

(v) Heating-Pressurizing Process (a pressure increase process): The change in a predetermined physical quantity that occurs in any of the members to be bonded 10 (10A, 10B), the bonding material 12, and the ambient atmosphere thereof, or the elapsed time from the initiation of the heating is measured, and at the time point when the change in the physical quantity has reached a certain amount or after a certain elapsed time, the applied pressure is increased from a comparatively low pressure to a comparatively high pressure.

(vi) Bonding Process (a bonding completion process): While the bonding material 12 is maintained at the bonding temperature thereof or higher, the members to be bonded 10 (10A, 10B) are bonded together by imparting a pressure to obtain the necessary bonding strength to the members to be bonded 10 (10A, 10B).

During the above processes, it is important that the pressure increase timing to reach (vi) the bonding process (the bonding completion process) from (iv) the heating-pressurizing process (the gas venting process) be measured correctly, and in the embodiment of the present invention, this timing is correctly calculated by the following procedure.

FIG. 2 shows an example of thermal properties of the bonding material 12 that has been found by using thermal analysis (TG) and the like. Here, the abscissa shows the heating elapsed time t(s), and the ordinate shows the weight m (g) and the temperature T (° C.) of the bonding material 12. In addition, for a certain time from the initiation of the heating, the weight m of the bonding material 12 is a constant value m1, but when the temperature T exceeds a predetermined temperature T1, the weight starts to decrease, and when the temperature exceeds a temperature T2, the decrease in the weight stops and attains a constant value m2. This phenomenon originates in that the bonding material 12 from which the solvent 22 has already vaporized is further heated, and thus the organic protective film 16 vaporizes from the bonding material 12. In addition, the temperature T1 is the decomposition initiation temperature of the organic protective film 16 contained in the bonding material 12, and the temperature T2 is the decomposition completion temperature at which the organic protective film 16 contained in the bonding material 12 has substantially completely decomposed.

Note that in the case where the speed of the rise in the temperature T is made constant, the elapsed time t1 from the initiation t0 of the heating to the decomposition initiation temperature T1 (of the organic protective film 16) and the elapsed time t2 to the same decomposition completion temperature T2 are both strictly associated. In addition, during thermal decomposition of the organic protective film 16, a change (reduction) also occurs in the thickness of the bonding material. Furthermore, during thermal decomposition of the organic protective film 16, a change (increase) also occurs in the decomposition gas concentration of the organic protective film that is present in the ambient atmosphere of the members to be bonded 10 or the bonding material 12.

In addition, FIG. 3 shows the relationship between the applied pressure P (MPa) that is applied to the members to be bonded 10 and the bonding strength I (MPa) of the members to be bonded 10 from (iv) the heating-pressurizing process (the gas venting process) to (vi) the bonding process (the bonding completion process) that are shown in FIG. 1. Here, the bonding strength I is found by using a tensile shear test (test equipment: an autograph made by Shimazu; maximum thrust, 10 kN; test speed, 6.0 m/min). In FIG. 3, under the applied pressure condition that falls below the applied pressure P1, it is not possible to obtain the necessary bonding strength due to insufficient applied pressure, and under the applied pressure condition that exceeds the applied pressure P2, it is not possible to obtain the necessary bonding strength due to gas venting defects.

Thus, in the embodiment of the present invention, these values of the applied pressures P1 and P2 are ascertained in advance for each bonding material that is used, the applied pressure that is comparatively low in (iv) the heating-pressurizing process (the gas venting process) is set to P1 (for example, P1≦10 MPa), and in (v) the heating-pressurizing process (the pressure increase process), the applied pressure is increased to P2 (for example, P2≧30 MPa). In addition, the pressure increase rate in (v) the heating-pressurizing process (the pressure increase process) is suitably set according to the composition of the bonding material that is used.

Using the above as a basis, in the embodiment of the present invention, it is possible to use various methods such as those described below in order to correctly calculate the pressure increase timing.

Method 1 (a method in which the temperature serves as the reference): In a test process, after the initiation of the heating of the members to be bonded 10 and the bonding material 12, the temperature T2 at the time point when the thermal decomposition of the organic protective film 16 that covers the metal nanoparticles 18 has completed is ascertained in advance. In addition, in (iv) the heating-pressurizing process (the gas venting process), under a heating condition that is identical to that of the test process, the members to be bonded 10 and the bonding material 12 are heated, and at the time point when the temperature of the members to be bonded 10 and the bonding material 12 reaches the temperature T2 corresponding to the time point when the thermal decomposition of the organic protective film 16 has completed, the process moves to (v) the heating-pressurizing process (the pressure increase process), and the pressure is increased from the applied pressure P1 that is comparatively low to the applied pressure P2 that is comparatively high.

Note that in the case where a press die is used in a heat pressure welding operation, in either the test process or the actual pressure welding process, the temperature of the members to be bonded 10 and the bonding material 12 can be correctly ascertained by measuring the temperature of the press die in the vicinity of the portion that is in contact with the members to be bonded. Alternatively, the temperature of the members to be bonded 10 may be ascertained by using a general-use temperature measuring device such as a thermocouple.

Method 2 (a method in which the weight serves as the reference): In a test process, the amount of the weight reduction from the initiation of the heating of the members to be bonded 10 and the bonding material 12 to the time point when the thermal decomposition of the organic protective film 16 that covers the metal nanoparticles 18 has completed is ascertained in advance. In addition, in (iv) the heating-pressurizing process (the gas venting process), under a heating condition that is identical to that of the test process, the members to be bonded 10 and the bonding material 12 are heated, the amount of the weight reduction in the bonding material 12 from the initiation of the heating of the members to be bonded 10 and the bonding material 12 is measured, at the time point when this amount of reduction reaches an amount of reduction (m1−m2) corresponding to the time point when the thermal decomposition of the organic protective film 16 has completed, the process moves to (v) the heating-pressurizing process (the pressure increase process), and the pressure is increased from the applied pressure P1 that is comparatively low to the applied pressure P2 that is comparatively high.

Note that, in such a method, preferably, the applied amount of the bonding material 12 that is applied to the members to be bonded that are actually bonded, and the applied amount of the bonding material 12 in the test process should precisely match to the extent possible.

Method 3 (a method in which the elapsed time serves as the reference): In a test process, the elapsed time (t2−t0) from the initiation of the heating of the members to be bonded 10 and the bonding material 12 to the time point when the thermal decomposition of the organic protective film 16 that covers the metal nanoparticles 18 has completed is ascertained in advance. In addition, in (iv) the heating-pressurizing process (the gas venting process), under a heating condition that is identical to that of the test process, the members to be bonded 10 and the bonding material 12 are heated, at the time point when the heating time reaches the elapsed time (t2−t0), the process moves to (v) the heating-pressurizing process (the pressure increase process), and the pressure is increased from the applied pressure P1 that is comparatively low to the applied pressure P2 that is comparatively high.

Method 4 (a method in which the amount of the reduction in the thickness serves as the reference): In a test process, the amount of the reduction in the thickness of the bonding material 12 from the initiation of the heating of the members to be bonded 10 and the bonding material 12 to the time point when the thermal decomposition of the organic protective film 16 that covers the metal nanoparticles 18 has completed is ascertained in advance. In addition, in (iv) the heating-pressurizing process (the gas venting process), under a heating condition that is identical to that of the test process, the members to be bonded 10 and the bonding material 12 are heated, at the time point when the amount of the reduction in the thickness of the bonding material 12 from the initiation of the heating of the members to be bonded 10 and the bonding material 12 has reached the amount of the reduction corresponding to the time point when the thermal decomposition of the organic protective film has completed, the process moves to (v) the heating-pressurizing process (the pressure increase process), and the pressure is increased from the applied pressure P1 that is comparatively low to the applied pressure P2 that is comparatively high.

Note that, in such a method, preferably, the thickness of the bonding material 12 that is applied to the members to be bonded that are actually bonded, and the thickness of the bonding material 12 in the test process should precisely match to the extent possible.

Method 5 (a method in which the decomposition gas concentration of the organic protective film serves as the reference): In a test process, the amount of the increase in the decomposition gas concentration of the organic protective film 16 that is present in the ambient atmosphere of the members to be bonded 10 or the bonding material 12 from the initiation of the heating of the members to be bonded 10 and the bonding material 12 to the time point when the thermal decomposition of the organic protective film 16 that covers the metal nanoparticles 18 has completed is ascertained in advance. In addition, under a heating condition that is identical to that in the test process of (iv) the heating-pressurizing process (the gas venting process), the members to be bonded 10 and the bonding material 12 are heated, at the time point when the amount of the increase of the decomposition gas concentration of the organic protective film 16 that is present in the ambient atmosphere of the members to be bonded 10 or the bonding material 12 from the initiation of the heating of the members to be bonded 10 and the bonding material 12 reaches an amount of the increase corresponding to the time point when the thermal decomposition of the organic protective film 16 has completed, the process moves to (v) the heating-pressurizing process (the pressure increase process), and the pressure is increased from the applied pressure P1 that is comparatively low to the applied pressure P2 that is comparatively high.

Note that, in such a method, preferably, the applied amount of the bonding material 12 that is applied to the members to be bonded that are actually bonded, and the applied amount of the bonding material 12 in the test process should precisely match to the extent possible.

The operational effects that can be obtained from the embodiment of the present invention that have the structure described above are as follows.

Specifically, in the bonding method according to the embodiment of the present invention, in the bonding process in which the bonding material 12 is heated so as to attain the bonding temperature thereof or higher, the bonding material 12 is applied to the bonding surface of the member to be bonded 10, the members to be bonded 10A, 10B are overlaid and aligned, and, at a comparatively early stage, the members to be bonded 10A, 10B together are pressurized by the applied pressure P1 that is comparatively low ((iv) heating-pressurizing process (the gas venting process)). Under the condition of the applied pressure that is comparatively low (the gas venting process), the organic protective film 16 is vaporized due to the bonding material 12 being heated, and the void portion of the porous structure that is formed by the metal nanoparticles 18 and the binder 20 of the bonding material 12 is not collapsed any more than necessary due to the applied pressure. Thus, the void portion of the porous structure functions as a degassing path for the gasified organic protective film 16, and the gas is smoothly released from between the members to be bonded 10A, 10B.

In addition, the change in a predetermined physical quantity that occurs in any of the members to be bonded 10, the bonding material 12, and the ambient atmosphere thereof, or the elapsed time from the initiation of the heating is measured, and at the time point when the change in the physical quantity has reached a certain amount or after a certain time has elapsed, the pressure is increased from the applied pressure P1 that is comparatively low to the applied pressure P2 that is comparatively high (the pressure increase process), and the bonding strength is increased by bonding the members to be bonded 10A, 10B together at the applied pressure P2 (the bonding process). Under the condition of the applied pressure P2 that is comparatively high, the void portion of the porous structure is suitably collapsed by the applied pressure, the metal nanoparticles are bonded in a high density, and thus the bonding strength is increased.

In addition, in a test process, the temperature change (T2−T1) of the members to be bonded 10 and the bonding material 12 from the initiation of the heating of the members to be bonded 10 and the bonding material 12 to the time point when the thermal decomposition of the organic protective film 16 has completed is ascertained in advance. Under a heating condition that is identical to that of the test process, the members to be bonded 10 and the bonding material 12 are heated, and the timing of the switching from the gas venting process (iv) to the pressure increase process (v) is correctly measured based on the temperature T2 after the initiation of the heating and the pressurization. Thus, it is possible to reliably carry out both the gas venting operation and the bonding operation.

In addition, in a test process, the amount of the weight reduction (m1–m2) from the initiation of the heating of the members to be bonded 10 and the bonding material to the time point when the thermal decomposition of the organic protective film 16 has completed is ascertained in advance. Under a heating condition that is identical to that of the test process, the members to be bonded 10 and the bonding material 12 are heated, and the timing of the switching from the gas venting process (iv) to the pressure increase process (v) is correctly measured based on the amount of the weight reduction (m1–m2) of the bonding material 12. Thus, it is possible to reliably carry out both the gas venting operation and the bonding operation.

In addition, in a test process, the elapsed time (t2–t0) from the initiation of the heating of the members to be bonded 10 and the bonding material 12 to the time point when the thermal decomposition of the organic protective film 16 has completed is ascertained in advance. Under a heating condition that is identical to that of the test process, the members to be bonded 10 and the bonding material 12 are heated, and the timing of the switching from the gas venting process (iv) to the pressure increase process (v) is correctly measured based on the elapsed time (t2–t0) from the initiation of the heating and the pressurization. Thus, it is possible to reliably carry out both the gas venting operation and the bonding operation.

In addition, in a test process, the amount of the reduction in the thickness of the bonding material 12 from the initiation of the heating of the members to be bonded 10 and the bonding material 12 to the time point when the thermal decomposition of the organic protective film 16 has completed is ascertained in advance. Under a heating condition that is identical to that of the test process, the members to be bonded 10 and the bonding material 12 are heated, and the timing of the switching from the gas venting process (iv) to the pressure increase process (v) is correctly measured based on the amount of the reduction in the thickness in the bonding material 12, and thereby it is possible to carry out both the gas venting operation and the bonding operation reliably.

In addition, in a test process, the amount of the increase in the decomposition gas concentration of the organic protective film 16 that is present in the ambient atmosphere of the members to be bonded 10 or the bonding material 12 from the initiation of the heating of the members to be bonded 10 and the bonding material 12 to the time point when the thermal decomposition of the organic protective film 16 has completed is ascertained in advance. Under a heating condition that is identical to that of the test process, the members to be bonded 10 and the bonding material 12 are heated, and the timing of the switching from the gas venting process (iv) to the pressure increase process (v) is accurately measured based on the amount of the increase in the decomposition gas concentration of the organic protective film 16. Thus, it is possible to carry out both the gas venting operation and the bonding operation reliably.

Note that the time point when thermal decomposition of the organic protective film 16 in the test process has completed can be correctly ascertained based on the rate of the weight change in the bonding material 12 that occurs due to heating the members to be bonded 10 and the bonding material 12, that is, the rate of the weight change ((m2–m1)/(t2–t1) in FIG. 2) that originates due to the vaporization of the organic protective film 16 from the bonding material 12. In addition, bonding is carried out after setting optimal maximum and minimum applied pressures (P2, P1) and setting the pressure increase rate in the pressure increase process, depending on the composition of the bonding material 12 that is used. Thus, it is possible to reliably carry out both the gas venting operation and the bonding operation.

Note that, in the embodiment of the present invention, it is possible to more accurately ascertain the time point when the thermal decomposition of the organic protective film has completed in the test process, by combining the determinations based on the changes in the plurality of physical quantities or the elapsed times to make a complex determination.

The invention claimed is:

1. A bonding method in which members to be bonded are bonded together by carrying out heating and firing in a state where metal nanoparticles are held at a predetermined position between the members to be bonded, wherein a bonding material that includes metal nanoparticles, which are coated with an organic protective film, and a binder is applied to a bonding surface of each of the members to be bonded, the members to be bonded are overlaid and aligned together, the members to be bonded are pressurized together by an applied pressure that is low while the bonding material is heated so as to attain a bonding temperature thereof or higher, a change in a predetermined physical quantity that occurs in any of the members to be bonded, the bonding material, and an ambient atmosphere thereof, or an elapsed time from the initiation of the heating is measured, and at the time point when the change in the physical quantity has reached a certain amount or after the elapse of a certain time, the applied pressure is increased to a high pressure.

2. The bonding method according to claim 1, wherein, in a test process, a temperature change in the members to be bonded or the bonding material is ascertained in advance from the initiation of the heating of the members to be bonded and the bonding material to the time point when thermal decomposition of the organic protective film has completed, and under a heating condition that is identical to that of the test process, the members to be bonded and the bonding material are heated, the temperature change in the members to be bonded or the bonding material from the initiation of the heating of the members to be bonded and the bonding material is measured, and at the time point when this temperature has reached a temperature corresponding to the time point when the thermal decomposition of the organic protective film has completed, the applied pressure is increased from a low pressure to a high pressure.

3. The bonding method according to claim 1, wherein, in a test process, an amount of weight reduction from the initiation of the heating of the members to be bonded and the bonding material to the time point when thermal decomposition of the organic protective film has completed is ascertained in advance, and under a heating condition that is identical to that of the test process, the members to be bonded and the bonding material are heated, an amount of weight reduction in the bonding material from the initiation of the heating of the members to be bonded and the bonding material is measured, and at the time point when the amount of this reduction attains an amount of reduction corresponding to the time point when the thermal decomposition of the organic protective film has completed, the applied pressure is increased from a low pressure to a high pressure.

4. The bonding method according to claim 1, wherein, in a test process, the elapsed time from the initiation of the heating of the members to be bonded and the bonding material to the time point when thermal decomposition of the organic protective film has completed is ascertained in advance, and under a heating condition that is identical to that of the test process, the members to be bonded and the bonding material are heated, and at the time point when the heating time has reached a time that corresponds to the elapsed time, the applied pressure is increased from a low pressure to a high pressure.

5. The bonding method according to claim 1, wherein, in a test process, an amount of reduction in the thickness of the bonding material from the initiation of the heating of the members to be bonded and the bonding material to the time point when thermal decomposition of the organic protective film has completed is ascertained in advance, and under a heating condition that is identical to that of the test process, the members to be bonded and the bonding material are heated, and at the time point when the amount of the reduction in the thickness of the bonding material from the initiation of the heating of the members to be bonded and the bonding material reaches an amount of reduction corresponding to the time point when the thermal decomposition of the organic protective film has completed, the applied pressure is increased from a low pressure to a high pressure.

6. The bonding method according to claim 1, wherein, in a test process, an amount of increase in a decomposition gas concentration of the organic protective film that is present in the ambient atmosphere of the members to be bonded and the bonding material from the initiation of the heating of the members to be bonded and the bonding material to the time point when thermal decomposition of the organic protective film has completed is ascertained in advance, and under a heating condition that is identical to that of the test process, the members to be bonded and the bonding material are heated, and at the time point when the amount of the increase in the decomposition gas concentration of the organic protective film that is present in the ambient atmosphere of the members to be bonded or the bonding material from the initiation of the heating of the members to be bonded and the bonding material reaches an increased amount corresponding to the time point when the thermal decomposition of the organic protective film has completed, the applied pressure is increased from a low pressure to a high pressure.

7. The bonding method according to claim 2, wherein the ascertaining of the time point when the thermal decomposition of the organic protective film in the test process has completed is carried out based on a rate of change in the weight of the bonding material that occurs due to the heating of the members to be bonded and the bonding material.

8. The bonding method according to claim 1, wherein the values of an applied pressure that is low and an applied pressure that is high when the members to be bonded are pressurized together, and an increase rate per unit time when the applied pressure is increased from the low pressure to the high pressure are set depending on a composition of the bonding material.

* * * * *